United States Patent
Tortorelli et al.

(10) Patent No.: US 9,196,530 B1
(45) Date of Patent: Nov. 24, 2015

(54) FORMING SELF-ALIGNED CONDUCTIVE LINES FOR RESISTIVE RANDOM ACCESS MEMORIES

(75) Inventors: Innocenzo Tortorelli, Moncalieri (IT); Fabio Pellizzer, Cornate d'Adda (IT); Pietro Petruzza, Pessano con Bornago (IT)

(73) Assignee: Micron Technology, Inc., Boise, ID (US)

(*) Notice: Subject to any disclaimer, the term of this patent is extended or adjusted under 35 U.S.C. 154(b) by 612 days.

(21) Appl. No.: 12/782,809

(22) Filed: May 19, 2010

(51) Int. Cl.
*H01L 21/44* (2006.01)
*H01L 21/768* (2006.01)

(52) U.S. Cl.
CPC ............................ *H01L 21/76897* (2013.01)

(58) Field of Classification Search
CPC ................................................ H01L 21/76897
See application file for complete search history.

(56) References Cited

U.S. PATENT DOCUMENTS

| | | | |
|---|---|---|---|
| 2003/0155609 A1* | 8/2003 | Mandelman et al. | 257/331 |
| 2003/0234449 A1* | 12/2003 | Aratani et al. | 257/758 |
| 2005/0151256 A1* | 7/2005 | Natzle | 257/750 |
| 2007/0123018 A1* | 5/2007 | Asano | 438/597 |
| 2007/0187801 A1* | 8/2007 | Asao et al. | 257/613 |
| 2008/0151612 A1* | 6/2008 | Pellizzer et al. | 365/163 |
| 2009/0014706 A1* | 1/2009 | Lung | 257/4 |
| 2009/0016094 A1* | 1/2009 | Rinerson et al. | 365/148 |
| 2010/0006816 A1 | 1/2010 | Magistretti et al. | |
| 2010/0054030 A1* | 3/2010 | Lowrey | 365/163 |
| 2010/0207095 A1* | 8/2010 | Lai et al. | 257/4 |
| 2010/0208517 A1* | 8/2010 | Lo et al. | 365/175 |
| 2010/0232200 A1* | 9/2010 | Shepard | 365/51 |
| 2011/0080766 A1* | 4/2011 | Chang et al. | 365/148 |

* cited by examiner

*Primary Examiner* — Zandra Smith
*Assistant Examiner* — Andre' C Stevenson
(74) *Attorney, Agent, or Firm* — Dorsey & Whitney LLP

(57) ABSTRACT

Resistive random access memory elements, such as phase change memory elements, may be defined using a plurality of parallel conductive lines over a stack of layers, at least one of which includes a resistive switching material. The stack may be etched using the conductive lines as a mask. As a result, memory elements may be self-aligned to the conductive lines.

19 Claims, 3 Drawing Sheets

FORMING SELF-ALIGNED CONDUCTIVE LINES FOR RESISTIVE RANDOM ACCESS MEMORIES

This relates generally to resistive random access memories (ReRAM).

ReRAM relies on materials that can be electrically switched between a higher conductive state and a lower conductive state several times. One type of ReRAM, a phase change memory, uses phase change materials, i.e., materials that may be electrically switched between a generally amorphous and a generally crystalline state. One type of phase change memory element utilizes a phase change material that may be, in one application, electrically switched between a structural state of generally amorphous and generally crystalline local order or between different detectable states of local order across the entire spectrum between completely amorphous and completely crystalline states.

A phase change memory element may be formed from a stack of layers including, for example, a chalcogenide layer, a heater, and electrode layers. During the etching of the individual memory elements from this stack, a relatively high aspect ratio structure results, made up of strips of materials defined by the stack. It is sometimes desirable to use a copper metal line for the bitline in order to reduce resistance, especially in relatively small feature sized technologies.

DETAILED DESCRIPTION

In accordance with some embodiments, a ReRAM memory array may be formed of individual memory elements coupled in a grid of address lines, which may be called rows and bitlines. Conventionally, ReRAM memory arrays include a memory element and a select device in series for each memory element. The select device may be a bipolar junction transistor, an MOS transistor, an ovonic threshold switch, or any other suitable switch.

Because of the number of layers that form the stack that is etched to form the individual memory elements, a relatively high aspect ratio structure results in some cases. On top of the stack may be copper bitlines that reduce the resistance of the resulting memory array.

The metal bitlines on the top of the stack may be patterned. Conventionally, this raises cost issues with respect to extra masks and alignment issues, especially at relatively reduced pitch levels. Moreover, the deposition of metal on top of the stack raises issues with respect to filling the dielectric material between adjacent bitlines in order to avoid copper extrusion and possible shorts.

In accordance with some embodiments, the entire array may be defined using only one mask to pattern a relatively small pitch metal bitline with reasonably low sheet resistance. In some embodiments, the bitlines are defined on top of the whole stack and then used as a mask to complete a self-aligned etch of the entire stack. This etch may use a standard blanket dry etch with relatively high bitline metal selectivity in some embodiments. As a result, the constraints on the filling dielectric may be relaxed because no metal line will be subsequently patterned on top of the final stack, in some embodiments.

Figure 1:
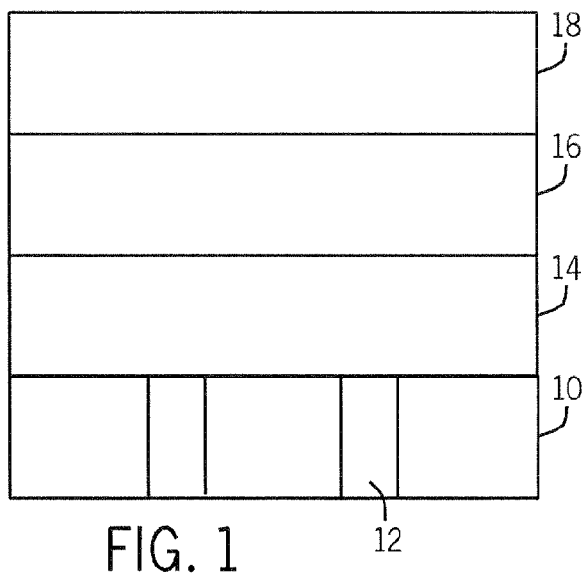
FIG. 1 is an enlarged, cross-sectional view of a stack of layers in the course of forming a ReRAM memory according to one embodiment.

Referring to FIG. 1, a stack to form an array of ReRAM memory elements may be formed on top of a semiconductor substrate (not shown). Select devices (not shown) may be formed in that substrate or inside the total stack (back end selectors). A plurality of bottom electrodes 10 may be defined. The electrodes 10 may be separated by a dielectric material 12. In some embodiments, the bottom electrodes may be tungsten and the dielectric material may be silicon dioxide, but other materials may also be used.

In an embodiment where the ReRAM memory is a phase change memory, a heater layer 14 may be made of any suitable material compatible with the other materials in the stack in order to provide Joule heating of the overlying chalcogenide layer 16. For example, titanium silicon nitride may be used in one embodiment. The Joule heating may be used to transition the chalcogenide between more and less conductive states. Particularly, the chalcogenide material may be associated with amorphous and crystalline phases, as well as, in some cases, a variety of intermediate phases. The heater layer 14 may be responsible for providing Joule heat for phase transition.

Finally, a cap 18 may be formed over the resistive switching material 16. The cap 18 may ultimately form the upper electrodes of the memory elements and may be formed of a suitable, compatible, conductive material. Suitable materials for the cap include titanium, titanium nitride or tungsten. The resistive switching material 16 may be, for example, a phase change material based on germanium, antimony, tellurium, called GST, for example. Examples of resistive switching material 16 for non-phase change ReRAM memories may include nickel oxide, copper, or silver charge transfer complexes, iron oxides, titanium dioxide, $SiO_2$, $SrZrO_3$, $PrO_7CaO_3$, or $MnO_x$.

The cross-section shown in FIG. 1 is in the X or row direction. Thus, the bitlines extend into the page in FIG. 1.

Figure 2:
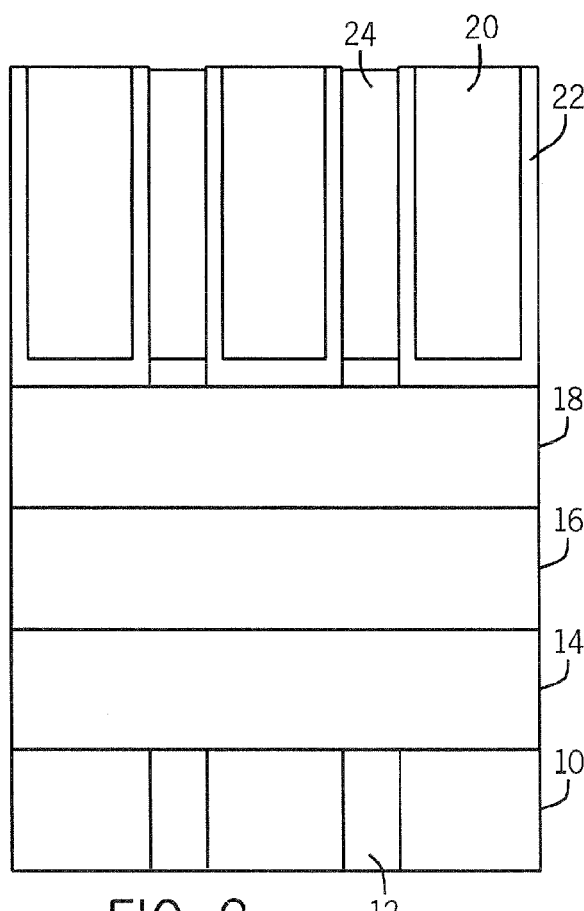
FIG. 2 is an enlarged, cross-sectional view of the stack shown in FIG. 1 after additional layers have been deposited and patterned.

In FIG. 2, the conductive lines 20 have already been deposited and extend as strips into the page in the bitline direction. The metal lines may be copper or copper alloy and may include a seed layer (not shown). The lines 20 may be metal and may be bitlines in some embodiments.

A barrier 22 surrounds each line 20 on three sides, in some embodiments. The barrier 22 chemically isolates the lines from the switching layer, reducing the copper diffusion into the active material in the embodiments where the lines 20 are formed of copper. The barrier 22 is conductive. Suitable materials for the barrier 22 include tantalum, tantalum containing compounds, titanium and titanium containing compounds.

A filling dielectric 24 separates one line 20 from its neighbors. The lines 20 may be formed using standard damascene processing. The dielectric 24 may be different from, or the same as, the dielectric material 12, in some embodiments.

Figure 3:
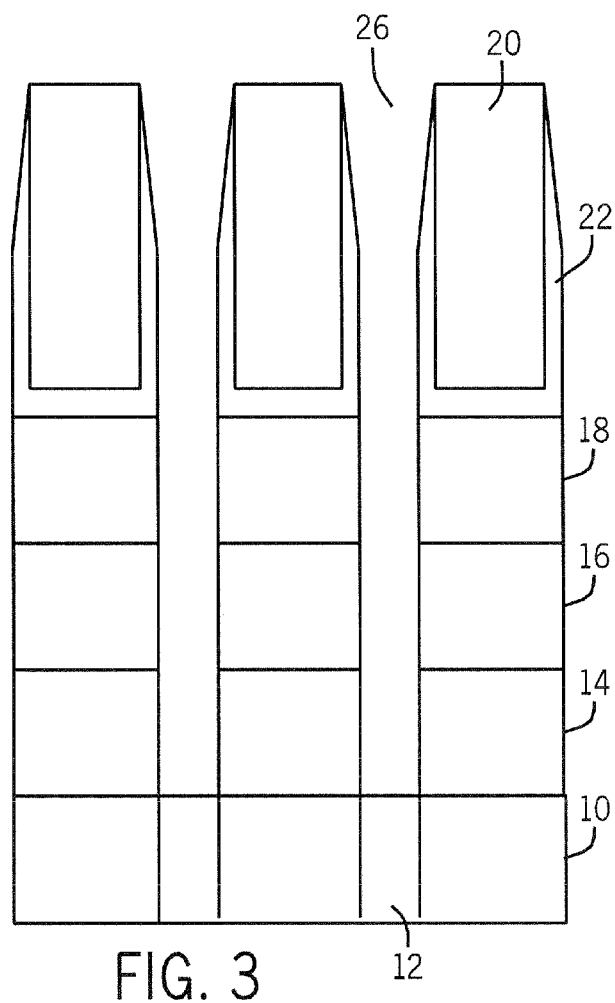
FIG. 3 is an enlarged, cross-sectional view of the embodiment shown in FIG. 2 after a blanket etch in accordance with one embodiment.

Next, the lines 20 are used as hard masks for a self-aligned blanket etch of the entire stack, as indicated in FIG. 3. In one embodiment, the blanket etch is a highly selective to the line material (such as copper). For example, a plasma etch using CF4 etchant may be used, but any etch able to etch active material and most common dielectrics, including oxide and nitride, may also be used. The etch may go all the way down and stop on the dielectric layer 12, forming spaced trenches 26. The trenches 26 may stop because of the nature of the dielectric material 12 in some embodiments. But, in other embodiments, a fixed time etch plus over-etch may be used.

As a result of the self-aligned etching, some of the barrier material 22 may be removed at the upper ends of the lines 20, as depicted in FIG. 3. In addition, some over-etching may occur down into the dielectric material 12 without adverse affect.

Thus, after defining the lines 20, only a single etch (and no additional masking) is needed to etch the entire stack because the metal lines act as hard masks in some embodiments. Thus, only one dedicated mask is needed, in some embodiments, and that mask is used to define the lines 20.

Figure 4:
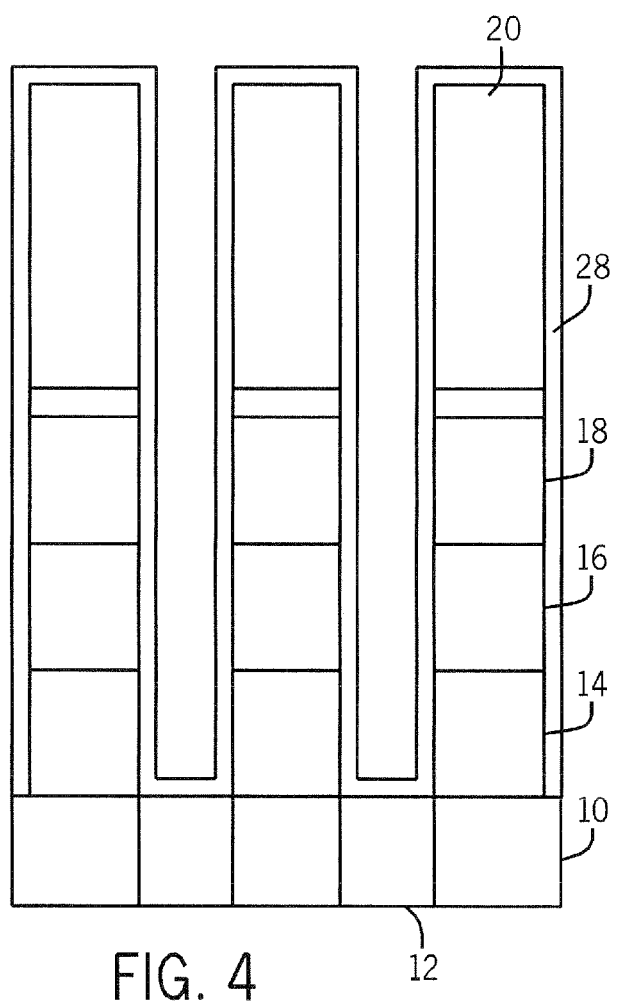
FIG. 4 is an enlarged, cross-sectional view of the embodiment shown in FIG. 3 after sealing.

Next, as shown in FIG. 4, the entire structure may be sealed with an appropriate sealing material 28 deposited over the etch structure shown in FIG. 3. The sealing material 28 need not totally fill the voids between adjacent lines 20. Even with a high aspect ratio stack (e.g. seven to one), the filling constraints are relaxed in some embodiments. The filling constraints are relaxed because if some voids are present between adjacent bitlines, no other metal would be patterned on top of the structure. Therefore, the risk of subsequent metal extrusions is reduced because of the absence of overlying metal. Conventionally, the sealing material may be oxide or nitride, but any other dielectric material may be used.

As a result, the memory elements are self-aligned to the overlying lines 20. As used herein, "self-aligned" means that edges of a memory element are either perfectly aligned with edges of a line 20 or edges of the memory element overlap or underlap edges of the line, but do so by substantially the same amount on opposing sides.

Programming to alter the state or phase of the material may be accomplished by applying voltage potentials to the bottom electrodes 10 and lines 20, thereby generating a voltage potential across a memory element including a resistive switching material 16. Considering the case of phase change memories, when the voltage potential is greater than the threshold voltages of any select device and memory element, then an electrical current may flow through the heater 14 and material 16 in response to the applied voltage potentials, and may result in heating of the material 16.

This heating may alter the memory state or phase of the material 16, in one phase change memory embodiment. Altering the phase or state of the material 16 may alter the electrical characteristic of memory material, e.g., the resistance or threshold voltage of the material may be altered by altering the phase of the memory material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    defining a plurality of electrodes over a semiconductor substrate;
    separating the plurality of electrodes with a first dielectric material;
    forming a heater layer over the plurality of electrodes and first dielectric material;
    forming a resistive switching material layer over the heater layer;
    forming an upper electrode layer over the heater layer;
    forming a second dielectric material over the upper electrode layer;
    forming a plurality of trenches through the second dielectric material to the upper electrode layer;
    forming a conformal barrier layer in the plurality of trenches;
    depositing a plurality of metal conductive lines in the plurality of trenches over the conformal barrier layer; and
    using the plurality of metal conductive lines as a mask, dry etching through the second dielectric material, upper electrode layer, resistive switching material layer, and heater layer to define individual resistive random access memory elements.

2. The method of claim 1, wherein the resistive switching material layer comprises a phase change material.

3. The method of claim 2, wherein the phase change material comprises chalcogenide.

4. The method of claim 1, further comprising sealing the individual resistive random access memory elements with a third dielectric material.

5. The method of claim 1, wherein the plurality of metal conductive lines comprise copper.

6. The method of claim 1, further comprising forming a seed layer over the conformal barrier layer.

7. The method of claim 1 wherein the dry etching comprises blanket etching using an etchant that is selective to the plurality of metal conductive lines.

8. The method of claim 1, wherein the plurality of metal conductive lines comprises copper.

9. An apparatus comprising:
    a plurality of spaced metal conductive lines; and
    a plurality of memory elements disposed below said plurality of spaced metal conductive lines, each of said plurality of memory elements being self-aligned to a spaced metal conductive line of said plurality of spaced metal conductive lines, wherein each of the plurality of memory elements includes a resistive switching material;

a plurality of first electrodes arranged between the plurality of memory elements and the plurality of spaced metal conductive lines;
a plurality of heaters arranged below the plurality of memory elements;
a plurality of second electrodes arranged below the plurality of heaters; and
a barrier layer arranged between the plurality of metal conductive lines and the plurality of first electrodes, wherein the barrier layer is further arranged to contact two vertical parallel sides of each of the plurality of metal conductive lines, said barrier layer being conductive.

10. The apparatus of claim 9 wherein said resistive switching material comprises at least one of germanium, antimony, and tellurium.

11. The apparatus of claim 9 wherein said resistive switching material comprises at least one of a silver charge transfer complex, $SrZrO_3$, or $PrO_7CaO_3$.

12. The apparatus of claim 9 wherein said plurality of metal conductive lines are bit lines included in a memory array.

13. The apparatus of claim 9 wherein said metal conductive lines comprise copper.

14. The apparatus of claim 9 wherein said resistive switching material includes a chalcogenide.

15. The apparatus of claim 9, wherein the plurality of second electrodes are couples to a plurality of select devices of a memory array.

16. A method comprising:
forming a stack of layers, wherein the stack of layers includes:
a first layer including a plurality of electrodes in a dielectric material;
a heater layer over the first layer;
a phase change memory material layer over the heater layer;
a second electrode layer over the phase change memory material layer;
a barrier layer over the second electrode layer;
forming a first plurality of trenches and a second plurality of trenches in the barrier layer of the stack of layers, wherein trenches of the first plurality of trenches are spaced from each other by trenches of the second plurality of trenches;
filling the first set of trenches with a dielectric material;
filling the second set of trenches with metal conductive lines; and
using said metal conductive lines as a mask, dry etching said stack of layers to form a plurality of stacks separated by spaced trenches.

17. The method of claim 16 wherein the spaced trenches extend from the metal conductive liens to the dielectric material of the first layer, wherein the plurality of electrodes of the first layer are aligned under the heater layer of the plurality of stacks.

18. The method of claim 16 further comprising depositing a sealing material over the plurality of stacks and spaced trenches.

19. The method of claim 17, wherein the spaced trenches extend into the dielectric material of the first layer.

* * * * *